United States Patent
Chang et al.

(10) Patent No.: US 7,948,307 B2
(45) Date of Patent: May 24, 2011

(54) DUAL DIELECTRIC TRI-GATE FIELD EFFECT TRANSISTOR

(75) Inventors: Josephine B. Chang, Yorktown Heights, NY (US); Leland Chang, Yorktown Heights, NY (US); Chung-Hsun Lin, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/561,880

(22) Filed: Sep. 17, 2009

(65) Prior Publication Data

US 2011/0063019 A1    Mar. 17, 2011

(51) Int. Cl.
*H01L 25/00* (2006.01)
(52) U.S. Cl. ........................................ 327/566
(58) Field of Classification Search .................. 327/427, 327/434, 564, 565, 566
See application file for complete search history.

(56) References Cited

U.S. PATENT DOCUMENTS

| 7,071,064 | B2 | 7/2006 | Doyle et al. | |
|---|---|---|---|---|
| 7,268,033 | B2 | 9/2007 | Anderson et al. | |
| 7,393,733 | B2* | 7/2008 | Currie | 438/164 |
| 7,394,116 | B2* | 7/2008 | Kim et al. | 257/213 |
| 7,462,538 | B2* | 12/2008 | Li et al. | 438/264 |
| 2007/0184602 | A1 | 8/2007 | Anderson et al. | |
| 2008/0111185 | A1 | 5/2008 | Cheng | |
| 2008/0157207 | A1 | 7/2008 | Rachmady et al. | |
| 2008/0160684 | A1 | 7/2008 | Kang et al. | |
| 2008/0185649 | A1 | 8/2008 | Anderson et al. | |

\* cited by examiner

*Primary Examiner* — Jeffrey S Zweizig
(74) *Attorney, Agent, or Firm* — Scully, Scott, Murphy & Presser, P.C.; Vazken Alexanian

(57) ABSTRACT

A dual dielectric tri-gate field effect transistor, a method of fabricating a dual dielectric tri-gate field effect transistor, and a method of operating a dual dielectric tri-gate effect transistor are disclosed. In one embodiment, the dual dielectric tri-gate transistor comprises a substrate, an insulating layer on the substrate, and at least one semiconductor fin. A first dielectric having a first dielectric constant extends over sidewalls of the fin, and a metal layer extends over the first dielectric, and a second dielectric having a second dielectric constant is on a top surface of the fin. A gate electrode extends over the fin and the first and second dielectrics. The gate electrode and the first dielectric layer form first and second gates having a threshold voltage Vt1, and the gate electrode and the second dielectric layer form a third gate having a threshold voltage Vt2 different than Vt1.

25 Claims, 4 Drawing Sheets

START WITH PATTERNED Si FINs

1) DIELECTRIC FORMATION

2) METAL 1 DEPOSITION

3) DEPOSIT SiO2 AND CMP OFF TOP GATE

4) GROW SiON ON TOP GATE WITH RTP OXIDE (RPN, DPN, RTNO)

FIN INFORMATION ON BULK Si SUBSTRATE

FILL IN OXIDE ISOLATION BETWEEN FINS

DUAL DIELECTRIC TRI-GATE FIELD EFFECT TRANSISTOR

BACKGROUND OF THE INVENTION

1. Field of the Invention

This invention generally relates to semiconductor devices, and more specifically, to tri-gate field effect transistors.

2. Background Art

Due to the increasing difficulty in shrinking complementary metal-oxide-semiconductor (CMOS) transistor gate lengths while simultaneously controlling leakage current, the traditional single-gate metal-oxide-semiconductor field-effect transistor (MOSFET) structure may be supplanted by dual- or triple-gate MOSFET structures. These structures, by increasing the gate's control of the channel potential, allow greater ability to turn off MOSFETs with ultra-short channel lengths. Of the various multi-gate MOSFETs structures explored in recent years, the most promising in terms of manufacturability and performance are typically variations of the so-called "FinFET" structure. In these devices, strip or "fin" of silicon is formed, and subsequently the gate material is deposited and etched, so that the resulting gate surrounds the fin on the three exposed sides. The channel region of the device is located in the fin. Because the gate electrode and the gate dielectric surround the semiconductor body on three sides, the transistor essentially has three separate channels and gates.

Tri-gate device structures, in particular, are receiving substantial attention as a candidate for 22 nm technologies and beyond. Because there are three separate channels formed in the semiconductor body, the semiconductor body can be fully depleted when the transistor is turned on, thereby enabling the formation of a fully depleted transistor with gate lengths of less than 30 nanometers without requiring the use of ultra-thin semiconductor bodies or requiring photolithographic patterning of the semiconductor bodies to dimensions less than the gate length of the device.

Tri-gate device structures offer better electrostatic control, permitting gate length scaling. In addition, the current available per planar layout is potentially increased, as the sidewalls are gated regions.

BRIEF SUMMARY

Embodiments of the invention provide a dual dielectric tri-gate field effect transistor, a method of fabricating a dual dielectric tri-gate field effect transistor, and a method of operating a dual dielectric tri-gate field effect transistor. In one embodiment, the dual dielectric tri-gate field effect transistor comprises a semiconductor substrate, an insulating layer on said substrate, and at least one semiconductor fin on and extending upward from said insulating layer. A first dielectric layer having a first dielectric constant extends over first and second sidewalls of the fin. A metal layer extends over this first dielectric layer, and this metal layer and the first dielectric form a metal-dielectric layer. A second dielectric layer having a second dielectric constant, different than the first dielectric constant, is on a top surface of the fin. A gate electrode extends over the fin, the metal-dielectric layer, and the second dielectric layer. The gate electrode and the metal-dielectric layer form first and second gates having a threshold voltage $Vt1$, and the gate electrode and the second dielectric layer form a third gate having a threshold voltage $Vt2$ different than $Vt1$.

In one embodiment, the first dielectric layer is a high-k dielectric, and the metal layer and the first dielectric layer form a metal-high-k dielectric. For example, the high-k dielectric may be $HfO_2$, $ZrO_2$ or $Hf/Zr$, and the metal layer may be comprised of TiN or TaN.

An embodiment of the invention provides a method of fabricating a dual dielectric tri-gate field effect transistor. This method comprises providing a base structure comprising a semiconductor substrate, an insulating layer, and at least one semiconductor fin extending upward from the insulating layer, said fin having first and second lateral sides and a top. This method further comprises forming a first dielectric material layer extending over the first and second lateral sides of the fin, forming a metal layer over the first dielectric material layer, and forming a second dielectric material layer, different that the first dielectric material layer, extending over the top of the fin. A gate electrode is formed extending over the fin and the first and second dielectric layers; and the gate electrode and the first dielectric layer form first and second gates having a threshold voltage $Vt1$, and the gate electrode and the second dielectric layer form a third gate having a threshold voltage $Vt2$ different than $Vt1$.

In an embodiment, the first dielectric material is a high-k dielectric and the metal layer and the first dielectric material form a metal-high-k dielectric. In an embodiment, the first dielectric layer extends over substantially all of the first and second sides of the fin, the second dielectric layer extends over substantially all of the top surface of the fin, and the gate electrode is comprised of an electrode material extending over both the first and second dielectric layers.

An embodiment of the invention provides a method of operating a dual dielectric tri-gate field effect transistor (FET) comprising first, second and third gates, where the first and second gates have a threshold voltage of $Vt1$, and the third gate has a threshold voltage of $Vt2$ that is greater than $Vt1$. This method comprises applying a supply voltage $Vdd$ to the first, second and third gates of the FET, and operating the FET in a low power mode when $Vdd$ is less than $Vt2$ and greater than $Vt1$.

In an embodiment of the invention, the top surface of the gated region is engineered to have a threshold voltage $Vt1$ with a polysilicon gated SiON based dielectric and with metal high-k gated side surfaces to both have $Vt2$. A device with these properties will operate excellently in low $Vdd$ ($Vt2 > Vdd > Vt1$), low power mode, and when $Vdd$ is increased above $Vt2$, the device will operate in a high performance mode. In the low power mode, the device will also consume lower active power, as the gate capacitance of polysilicon gated SiON FETs will be much lower than MHK gated devices.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with a wide range of specific details. In other instances, well-known structures or processing steps have not been described in detail in order to avoid obscuring the invention.

Figure 1:
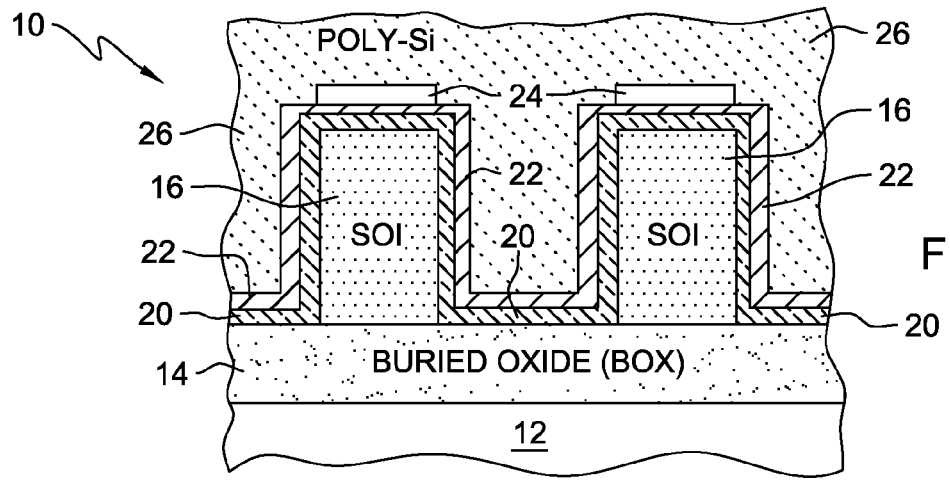
FIG. 1 shows a dual dielectric tri-gate structure in accordance with an embodiment of the invention.

FIG. 1 shows a dual dielectric tri-gate structure according to one embodiment of the present invention. Structure 10 comprises a base semiconductor substrate 12, an insulator layer 14, a plurality of semiconductor fins 16, Hi-K dielectric 20, metal layer 22, top gate dielectric 24, and gate electrode 26.

The base semiconductor substrate layer 12 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, the base semiconductor substrate layer 12 may be comprised of a Si-containing semiconductor material, i.e., a semiconductor material that includes silicon. Further, the base semiconductor substrate layer 12 may be doped or contain both doped and undoped regions. Although the base semiconductor substrate layer 12 may be a bulk semiconductor structure, it may also include a layered structure with one or more buried insulator layers (not shown).

The insulator layer 14 may comprise any suitable insulator material(s), and it typically comprises a buried oxide (BOX), a nitride, or an oxynitride in either a crystalline phase or a non-crystalline phase. The buried insulator layer 14 may be a homogeneous, continuous layer, or it may contain relatively large cavities or micro- or nano-sized pores (not shown). The physical thickness of the buried insulator layer 14 may vary widely depending on the specific applications, but it typically ranges from about 10 nm to about 500 nm, with from about 20 nm to about 200 nm being more typical. The present invention, in an embodiment, may utilize a bulk substrate, referred to as bulk FinFET or Trigat/FinFET on bulk substrate, discussed in more detail below.

The semiconductor fins 16 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it may be preferred that the semiconductor fins 16 be comprised of a Si-containing semiconductor material, i.e., a semiconductor material that includes silicon. Further, the semiconductor fins 16 may be doped or contain both doped and undoped regions therein. The physical thickness of the fins 16 may vary widely depending on the specific applications. As will be understood by those of ordinary skill in the art, fins 16 may be formed in other ways. For example, Side wall Image Transfer (SIT) may be used to define the fins.

Gate dielectric layer 20 extends over the sidewalls of semiconductor fins 16 and on or adjacent the insulating layer 14. Gate dielectric layer 20 can be any suitable dielectric material. For instance, the gate dielectric layer may be a silicon dioxide ($SiO_2$), silicon oxynitride ($SiO_xN_y$) or a silicon nitride ($Si_3N_4$) dielectric layer. In an embodiment of the present invention, the gate dielectric layer 20 may be a silicon oxynitride film formed to a thickness of between 5-20 Å. In an embodiment of the present invention, gate dielectric layer 20 may be a high K gate dielectric layer, such as a metal oxide dielectric, such as but not limited to tantalum pentaoxide ($Ta_2O_5$), and titanium oxide ($TiO_2$). Gate dielectric layer 20 can be other types of high K dielectric, such as but not limited to PZT.

Metal layer 22 extends over gate dielectric layer 20, and this layer 22 may be formed of a variety of suitable materials such as, but not limited to, tungsten, tantalum, titanium, and their nitrides. As another example, layer 22 may comprise polycrystalline silicon doped to a concentration density between $10^{19}$-$10^{20}$ atoms/cm$^3$. Also, layer 22 need not necessarily be a single material and can be a composite stack of thin films, such as but not limited to a polycrystalline silicon/metal electrode or a metal/polycrystalline silicon electrode.

Top gate dielectrics 24 are positioned on or adjacent top surfaces of fins 16. Dielectrics 24, similar to dielectric layer 20, can be any suitable dielectric material; and, for example, dielectrics 24 may be a silicon oxynitride SiON or a silicon nitride dielectric layer. In an embodiment of the invention, the gate dielectric 24 may be a silicon oxynitride film formed to a thickness of between 5-20 A.

The gate electrode layer 26 may comprise polycrystalline silicon (poly-silicon), metal such as Al, Cu, W, Ti, Ta, TiN, TaN, NiSi, CoSi, and/or other proper conductive materials. The gate electrode layer 26 may be formed by CVD, PVD, plating, ALD, and other suitable processes. The gate electrode layer 26 may have a multilayer structure and may be formed in a multiple-step process.

Figure 5:
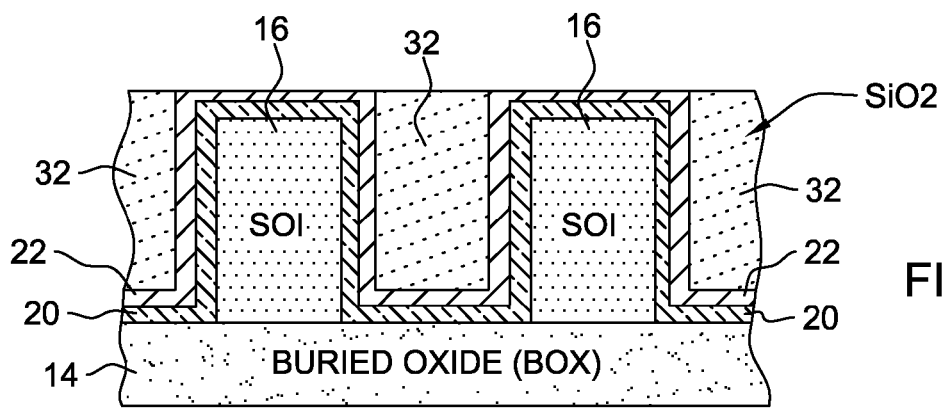
FIG. 5 shows a $SiO_2$ deposited on the structure of FIG. 4.
Figure 6:
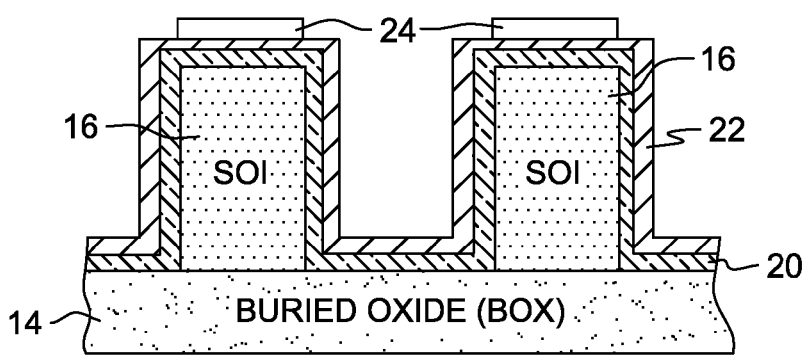
FIG. 6 illustrates a SiON grown on the Si fins shown in FIG. 5.
Figure 7:
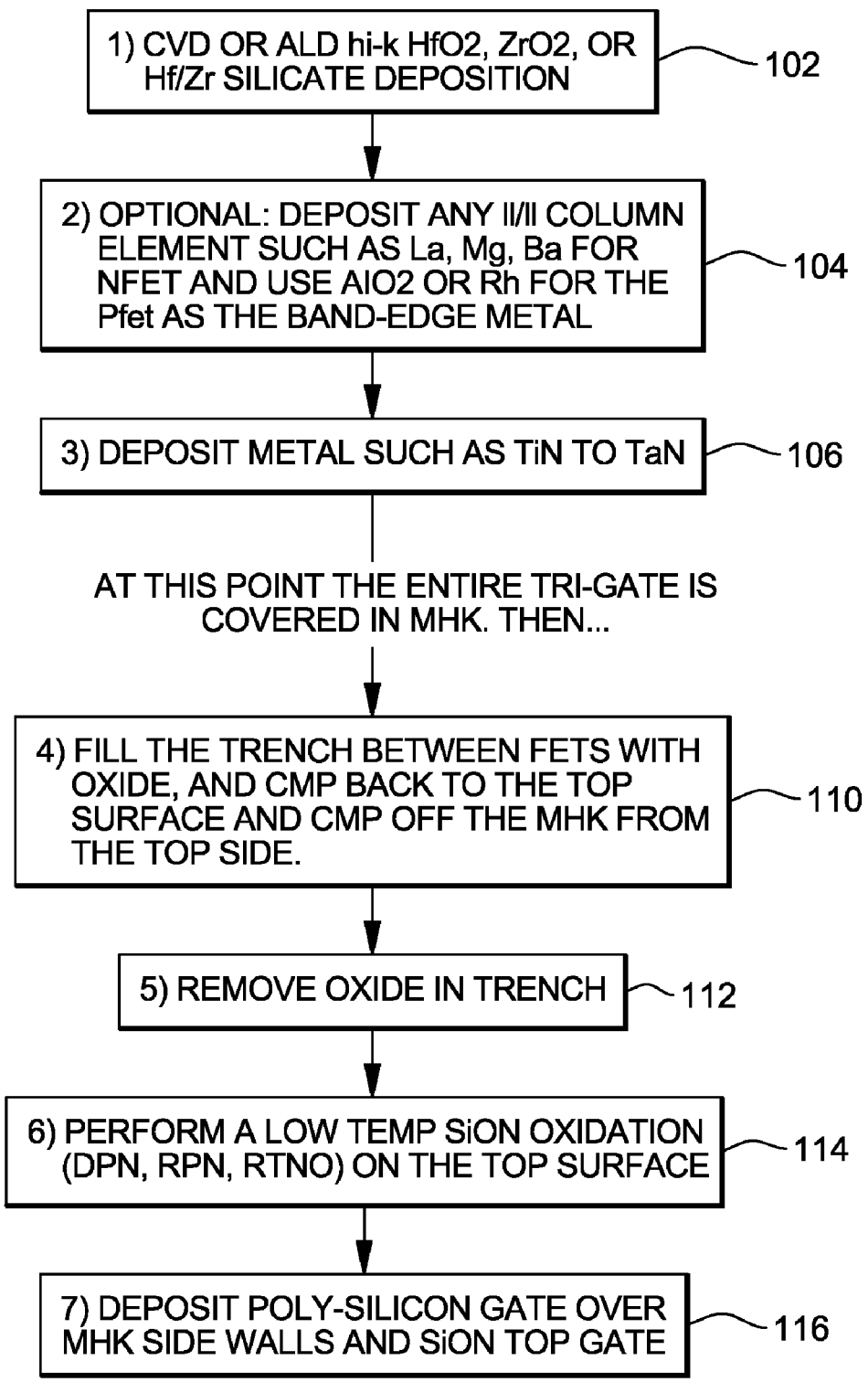
FIG. 7 shows a fabrication flow chart diagram according to an embodiment of the invention.

FIGS. 2-6 illustrate processing steps in the fabrication of the structure 10 shown in FIG. 1, and FIG. 7 shows a fabrication flow chart diagram according to an embodiment of the invention.

Figure 2:
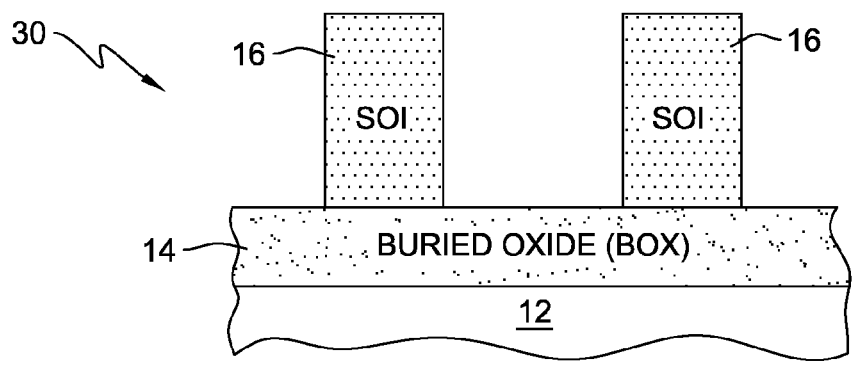
FIG. 2 illustrates a base structure from which the tri-gate structure of FIG. 1 is fabricated.

Generally, in embodiments of the invention, conventional fabrication steps can be used to form semiconductor substrate 12, insulator layer 14 and fins 16, as shown in FIG. 2. For example, in the manufacture of the device 10, a silicon substrate 12 forming a silicon semiconductor body may be provided with an insulating layer 14 and on top thereof a monocrystalline silicon layer. Such a semiconductor body can, for example, be obtained by implanting oxygen ions into a monocrystalline silicone substrate. However, other techniques to obtain such a start-point semiconductor body are feasible, such as using thermal oxidation of a semiconductor substrate. Subsequently, an implant may be performed to tune the electrical properties of the semiconductor/silicon layer 12.

After this, a hard mask layer, e.g., of silicon nitride or a silicon oxide, may be deposited and patterned on the semiconductor layer at the location at which fins are to be formed and where source and drains regions are envisaged for forming a FinFET device. This may be followed by an etching step to form the fins 16. Optionally, this may be followed by a surface treatment like an $H_2$ annealing step. Then, a poly silicon layer or hard mask layer is deposited and patterned, after which source and drain implants are done for forming source and drain regions that border the fin. During each of these two implants, the other regions of the structure are protected by, for example, a photo resist spot. After the source and drain implants are completed, the hard mask layer N is removed, also by (selective) etching.

Figure 3:
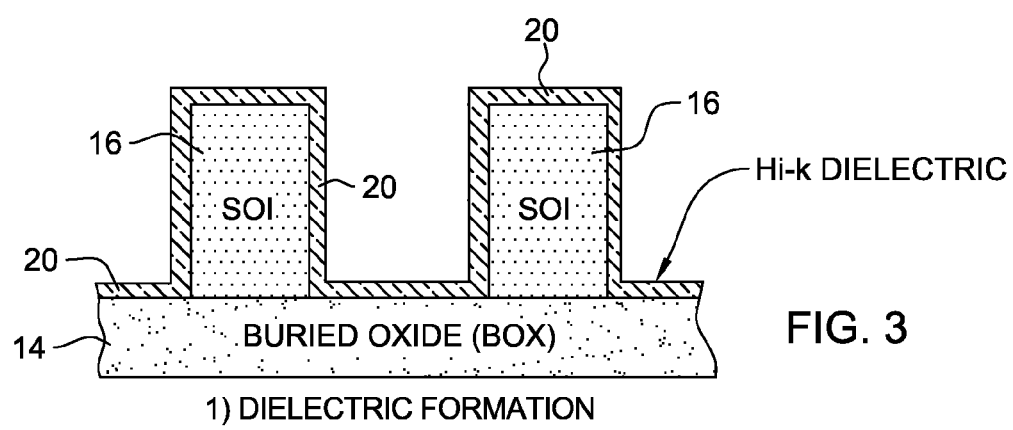
FIG. 3 depicts the formation of a high-k dielectric on the structure of FIG. 2

With reference to FIGS. 3 and 7, after the formation of structure 30 of FIG. 2, high-k dielectric layer 20 is formed at step 102. This may be done, for example, by a chemical vapor deposition (CVD) or an atomic layer deposition (ALD) hi-k $HfO_2$, $ZiO_2$ or Hf/Zr silicate deposition. The high-k dielectric layer 20 may contain any of the materials known in the art, including, but not limited to oxides of Zr, Hf, Al, HfSi, HfSiN, and combinations thereof. The thickness of high-k dielectric layer 20 may be between about 1.0 nm and about 2.5 nm.

An optional step 104 is to depost a band-edge metal on the hi-k dielectric layer 20. For an NFET, this may be done, for instance, by depositing any II/II column element such as La, MG, or Ba. For a PFET, $AlO_2$ or Rh may be deposited to form a base-edge metal.

Figure 4:
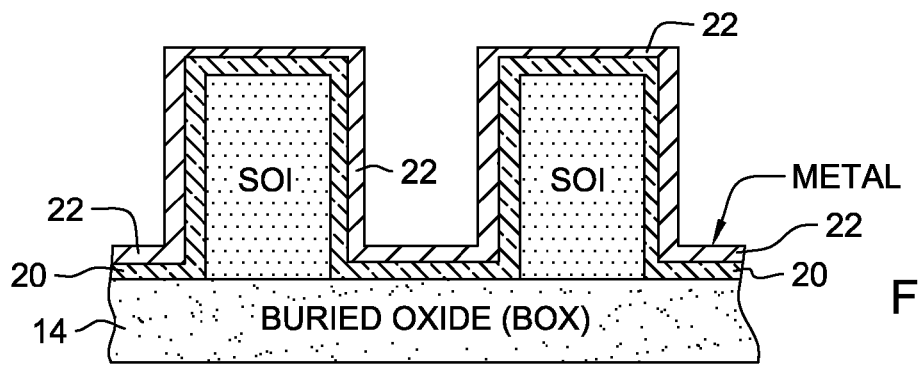
FIG. 4 illustrates a metal deposition on the high-k dielectric.

Step 106, illustrated in FIG. 4, is a metal deposition step to form metal layer 22. This layer extends over gate dielectric layer 20, and the metal layer 22 may be formed of a variety of suitable materials such as, but not limited to, tungsten, tantalum, titanium, and their nitrides. As another example, layer 22 may comprise polycrystalline silicon doped to a concentration density between $10^{19}$-$10^{20}$ atoms/$cm^3$. Also, layer 22 need not necessarily be a single material and can be a composite stack of thin films, such as but not limited to a polycrystalline silicon/metal electrode or a metal/polycrystalline silicon electrode.

At step 110, silicon dioxide ($SiO_2$), shown in FIG. 5 at 32, is deposited to fill the trenches between the fins 16 and to cover layer 22. In one embodiment, a silicon oxide layer is thickly deposited to cover the entire structure. Subsequently, Chemical-Mechanical Polishing (CMP) is performed to planarize the silicon oxide layer and to expose the tops of the fin-shaped structures 16.

At step 112, the oxide is removed from the trenches, and top gate dielectrics 24 are then grown, at step 114, on the tops of fins 16, as shown in FIG. 6. These top gate dielectrics can be any suitable dielectric material, and for example, dielectrics 24 may be a silicon oxynitride SiON or a silicon nitride dielectric layer. In an embodiment of the invention, the gate dielectric 24 may be a silicon oxynitride film formed to a thickness of between 5-20 A. Dielectrics 24 may be formed, for example, by rapid thermal processing (RTP) oxide, decoupled plasma nitridation (DPN) or by rapid thermal oxidation using NO gas (RTNO).

At step 116, polysilicon gate 26 (shown in FIG. 1) is deposited over the metal-hi-k (MHK) sidewalls and the SiON top gate dielectrics 24. This gate electrode layer 26 may comprise polycrystalline silicon (poly-silicon), metal such as Al, Cu, W, Ti, Ta, TiN, TaN, NiSi, CoSi, and/or other proper conductive materials. The gate electrode layer 26 may be formed by CVD, PVD, plating, ALD, and other suitable processes. Also, the gate electrode layer 26 may have a multilayer structure and may be formed in a multiple-step process.

With the above-described design, FET device 10 essentially has three separate channels and gates. Each fin 16 forms a top channel and two side channels. The top dielectric 24 and polysilicon material 26 form a first, top gate with a threshold voltage Vt1, and metal-hi-k dielectric layer 20, 22 and the polysilicon material 26 form two additional side gates with a threshold voltage Vt2.

Figure 8:
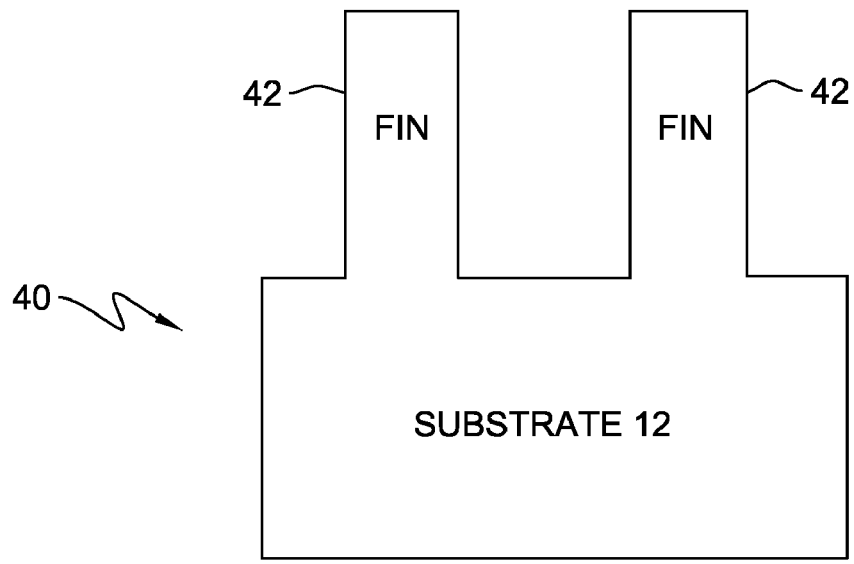
FIG. 8 depicts a bulk semiconductor substrate that may also be used, in an embodiment of the invention, in the fabrication of a transistor.
Figure 9:
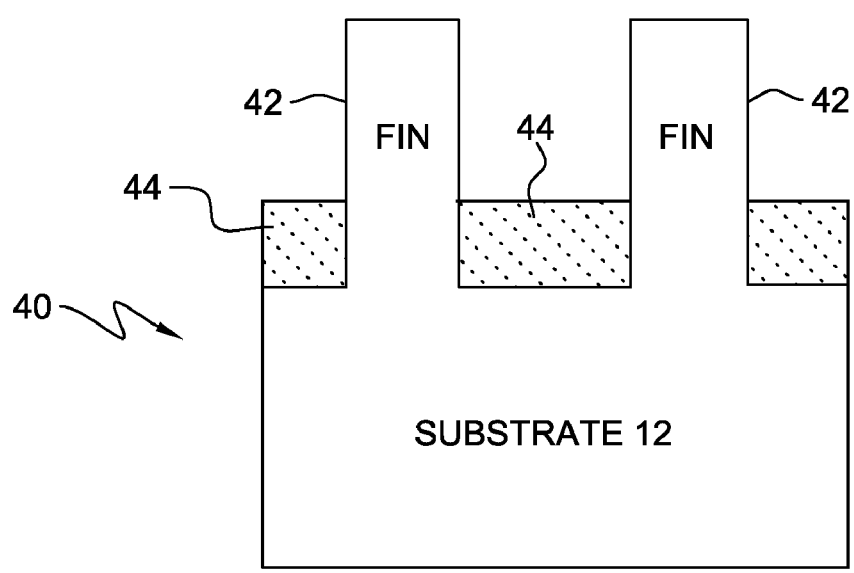
FIG. 9 illustrates an oxide layer on the bulk semiconductor substrate of FIG. 8.

As mentioned above, in an embodiment, the invention may be fabricated using a bulk substrate, referred to as a bulk Fin FET or Trigat/FinFET on bulk Si substrate. FIG. 8 shows such a bulk substrate, with fins 42. Any suitable bulk substrate may be used, and fins 42 may be formed thereon in any suitable way. As shown in FIG. 9, an oxide insulator layer 44 is deposited on substrate 44, between the fins 42. Any suitable oxide material may be used, and the oxide layer 44 may be formed or deposited on substrate 40 in any suitable manner. After layer 44 is formed, the resulting structure may be processed, for example, as described above in connection with FIGS. 2-7 to fabricate a dual dielectric trigate field effect transistor.

Embodiments of the invention have significant utility. For instance, in an embodiment of the invention, the top surface of the gated region may be engineered to have a threshold voltage Vt1 that is less than the threshold voltage Vt2 of the metal high-k gated side surfaces. A device with these properties will operate excellently in low Vdd (Vt2>Vdd>Vt1), low power mode, and when Vdd is increased above Vt2, the device will operate in a high performance mode. In the low power mode, the device will also consume lower active power, as the gate capacitance of polysilicon gated SiON FETs will be much lower than MHK gated devices.

While it is apparent that the invention herein disclosed is well calculated to fulfill the objects discussed above, it will be appreciated that numerous modifications and embodiments may be devised by those skilled in the art, and it is intended that the appended claims cover all such modifications and embodiments as fall within the true scope of the present invention.

The invention claimed is:

1. A dual dielectric tri-gate field effect transistor comprising:
    a semiconductor substrate;
    an insulating layer on said substrate;
    at least one semiconductor fin on and extending upward from said insulating layer, said fin including first and second sidewalls and a top surface;
    a first dielectric layer having a first dielectric constant extending over the first and second sidewalls of the fin;
    a metal layer extending over the first dielectric layer;
    a second dielectric layer having a second dielectric constant, different than the first dielectric constant, on the top surface of the fin; and
    a gate electrode extending over the fin and the first and second dielectric layers, wherein the gate electrode and the first dielectric layer form first and second gates having a threshold voltage Vt1, and the gate electrode and the second dielectric layer form a third gate having a threshold voltage Vt2 different than Vt1.

2. The dual dielectric tri-gate field effect transistor according to claim 1, wherein Vt2 is greater than Vt1.

3. The dual dielectric tri-gate field effect transistor according to claim 1, wherein Vt1 is greater than Vt1.

4. The dual dielectric tri-gate field effect transistor according to claim 1, wherein the first dielectric layer is a high-k dielectric, and the metal layer and the first dielectric layer form a metal-high-k dielectric.

5. The dual dielectric tri-gate field effect transistor according to claim 4, wherein the high-k dielectric is $HfO_2$, $ZrO_2$ or Hf/Zr.

6. The dual dielectric tri-gate field effect transistor according to claim 5, wherein the metal layer is comprised of TiN or TaN.

7. The dual dielectric tri-gate field effect transistor according to claim 1, wherein the second dielectric layer is a SiON dielectric.

8. The dual dielectric tri-gate field effect transistor according to claim 1, wherein the gate electrode is a polysilicon.

9. The dual dielectric tri-gate field effect transistor according to claim 1, further comprising a band-edge metal deposited on the semiconductor substrate.

10. The dual dielectric tri-gate field effect transistor according to claim 1, wherein:
    the first dielectric layer extends over substantially all of the first and second sides of the fin;

the second dielectric layer extends over substantially all of the top surface of the fin; and the gate electrode is comprised of an electrode material extending over both the first and second dielectric layers.

11. A dual dielectric tri-gate field effect transistor comprising:
   a semiconductor substrate;
   an insulating layer on said substrate;
   a plurality of semiconductor fin on and extending upward from said insulating layer, each of said fins including first and second sidewalls and a top surface;
   a first dielectric layer having a first dielectric constant extending over substantially all of the first and second sidewalls of the fins;
   a metal layer extending over the first dielectric layer;
   a second dielectric layer having a second dielectric constant, different than the first dielectric constant, and formed over substantially all of the top surfaces of the fins; and
   a gate electrode extending over the fin and the first and second dielectric layers, wherein the gate electrode and the first dielectric layer form first and second gates having a threshold voltage Vt1, and the gate electrode and the second dielectric layer form a third gate having a threshold voltage Vt2 different than Vt1.

12. The dual dielectric tri-gate field effect transistor according to claim 11, wherein Vt2 is greater than Vt1.

13. The dual dielectric tri-gate field effect transistor according to claim 11, wherein the first dielectric layer is a high-k dielectric, and the metal layer and the first dielectric layer form a metal-high-k dielectric.

14. The dual dielectric tri-gate field effect transistor according to claim 13, wherein the high-k dielectric is $HfO_2$, $ZrO_2$ or Hf/Zr, and the metal layer is comprised of TiN or TaN.

15. The dual dielectric tri-gate field effect transistor according to claim 11, wherein the gate electrode is a polysilicon material formed over the first and second electrode layers.

16. A method of fabricating a dual dielectric tri-gate field effect transistor comprising:
   providing a base structure comprising a semiconductor substrate, an insulating layer, and at least one semiconductor fin extending upward from the insulating layer, said fin having first and second lateral sides and a top;
   forming a first dielectric material layer extending over the first and second lateral sides of the fin;
   forming a metal layer over the first dielectric material layer;
   forming a second dielectric material layer, different that the first dielectric material layer, extending over the top of the fin; and
   forming a gate electrode extending over the fin and the first and second dielectric layers, wherein the gate electrode and the first dielectric layer form first and second gates having a threshold voltage Vt1, and the gate electrode and the second dielectric layer form a third gate having a threshold voltage Vt2 different than Vt1.

17. The method according to claim 16, wherein Vt2 is greater than Vt1.

18. The method according to claim 16, wherein the first dielectric material is a high-k dielectric and the metal layer and the first dielectric material form a metal-high-k dielectric.

19. The method according to claim 16, wherein the first dielectric layer extends over substantially all of the first and second sides of the fin.

20. The method according to claim 16, wherein
   the second dielectric layer extends over substantially all of the top surface of the fin; and
   the gate electrode is comprised of an electrode material extending over both the first and second dielectric layers.

21. A method of operating a dual dielectric tri-gate field effect transistor (FET) comprising first, second and third gates, the first gate having a threshold voltage of Vt1, and the third gate having a threshold voltage of Vt2 greater than Vt1, the method comprising:
   applying a supply voltage Vdd to the first, second and third gates of the FET; and
   operating the FET in a low power mode when Vdd is less than Vt2 and greater than Vt1.

22. The method according to claim 21, further comprising operating the FET in a high power mode when Vdd is greater than Vt2.

23. The method according to claim 21, wherein the FET includes a semiconductor fin, and the first and second gates comprise a metal-high-k dielectric and polysilicon gate electrode extending over a sidewall of said fin.

24. The method according to claim 23, wherein the third gate comprises a SiON dielectric and said polysilicon gate electrode extending over a top surface of the fin.

25. The method according to claim 23, wherein the metal-high-k dielectric comprises a TiN or TaN metal layer and a $HfO_2$, $ZrO_2$ or Hf/Zr high-k dielectric layer.

* * * * *